United States Patent
Gnadinger

(10) Patent No.: US 7,030,435 B2
(45) Date of Patent: *Apr. 18, 2006

(54) SINGLE TRANSISTOR RARE EARTH MANGANITE FERROELECTRIC NONVOLATILE MEMORY CELL

(75) Inventor: Fred P. Gnadinger, Colorado Springs, CO (US)

(73) Assignee: COVA Technologies, Inc., Colorado Springs, CO (US)

( * ) Notice: Subject to any disclaimer, the term of this patent is extended or adjusted under 35 U.S.C. 154(b) by 52 days.

This patent is subject to a terminal disclaimer.

(21) Appl. No.: 10/362,387

(22) PCT Filed: Aug. 24, 2001

(86) PCT No.: PCT/US02/13095

§ 371 (c)(1), (2), (4) Date: Feb. 21, 2003

(87) PCT Pub. No.: WO02/082510

PCT Pub. Date: Oct. 17, 2002

(65) Prior Publication Data

US 2003/0183859 A1    Oct. 2, 2003

Related U.S. Application Data

(60) Provisional application No. 60/272,986, filed on Mar. 2, 2001, provisional application No. 60/227,858, filed on Aug. 24, 2000.

(51) Int. Cl.
*H01L 29/792* (2006.01)
(52) U.S. Cl. .................................... 257/295
(58) Field of Classification Search ............. 257/295; 438/3, 658, 660, 666, 686
See application file for complete search history.

(56) References Cited

U.S. PATENT DOCUMENTS

| | | | |
|---|---|---|---|
| 3,832,700 | A | 8/1974 | Wu et al. |
| 4,860,254 | A | 8/1989 | Pott et al. |
| 5,046,043 | A | 9/1991 | Miller et al. |
| 5,060,191 | A | 10/1991 | Nagasaki et al. |
| 5,070,385 | A | 12/1991 | Evans, Jr. et al. |
| 5,146,299 | A | 9/1992 | Lampe et al. |
| 5,198,994 | A | 3/1993 | Natori |
| 5,227,855 | A | 7/1993 | Momose |
| 5,302,842 | A | 4/1994 | Chan |

(Continued)

FOREIGN PATENT DOCUMENTS

JP    408055919 A    2/1996

(Continued)

OTHER PUBLICATIONS

Tokumitsu, Eisuke et al, "Characterization of MF(M)IS structures using P(L)ZT and $Y_2O_3$ films", Jpn. J. of Appl. Phys., vol. 39, Sep. 2000, pp. 5456-5459.

(Continued)

*Primary Examiner*—Roy Potter
(74) *Attorney, Agent, or Firm*—William J. Kubida; Peter J. Meza; Hogan & Hartson LLP

(57) ABSTRACT

A memory device is formed of the one transistor cell type. Such a device has a substrate, a ferroelectric layer which is a film of rare earth manganite, and an interfacial oxide layer being positioned between the substrate and the ferroelectric layer. The invention includes such a device and methods of making the same.

9 Claims, 6 Drawing Sheets

U.S. PATENT DOCUMENTS

| | | | |
|---|---|---|---|
| 5,307,305 A | 4/1994 | Takasu |
| 5,345,414 A | 9/1994 | Nakamura |
| 5,365,094 A | 11/1994 | Takasu |
| 5,378,905 A | 1/1995 | Nakamura |
| 5,384,729 A | 1/1995 | Sameshima |
| 5,418,389 A | 5/1995 | Watanabe |
| 5,434,811 A | 7/1995 | Evans, Jr. et al. |
| 5,479,317 A | 12/1995 | Ramesh |
| 5,515,311 A | 5/1996 | Mihara |
| 5,519,235 A | 5/1996 | Ramesh |
| 5,523,964 A | 6/1996 | McMillan et al. |
| 5,536,672 A | 7/1996 | Miller et al. |
| 5,541,870 A | 7/1996 | Mihara et al. |
| 5,541,871 A | 7/1996 | Nishimura et al. |
| 5,541,873 A | 7/1996 | Nishimura et al. |
| 5,559,733 A | 9/1996 | McMillan et al. |
| 5,563,081 A | 10/1996 | Ozawa |
| 5,578,846 A | 11/1996 | Evans, Jr. et al. |
| 5,621,681 A | 4/1997 | Moon |
| 5,623,439 A | 4/1997 | Gotoh et al. |
| 5,736,759 A | 4/1998 | Haushalter |
| 5,739,563 A | 4/1998 | Kawakubo et al. |
| 5,744,374 A | 4/1998 | Moon |
| 5,757,042 A | 5/1998 | Evans, Jr. et al. |
| 5,768,185 A | 6/1998 | Nakamura et al. |
| 5,789,775 A | 8/1998 | Evans, Jr. et al. |
| 5,808,676 A | 9/1998 | Biegelsen et al. |
| 5,822,239 A | 10/1998 | Ishihara et al. |
| 5,825,317 A | 10/1998 | Anderson et al. |
| 5,858,533 A | 1/1999 | Greuter et al. |
| 5,872,739 A | 2/1999 | Womack |
| 5,877,977 A | 3/1999 | Essaian |
| 5,886,920 A | 3/1999 | Marshall et al. |
| 5,887,117 A | 3/1999 | Desu et al. |
| 5,919,515 A | 7/1999 | Yano et al. |
| 5,946,224 A | 8/1999 | Nishimura |
| 5,953,061 A | 9/1999 | Biegelsen et al. |
| 5,955,213 A | 9/1999 | Yano et al. |
| 5,962,884 A | 10/1999 | Hsu et al. |
| 5,977,577 A | 11/1999 | Evans, Jr. |
| 5,998,819 A | 12/1999 | Yokoyama et al. |
| 6,025,735 A | 2/2000 | Gardner et al. |
| 6,027,947 A | 2/2000 | Evans et al. |
| 6,031,754 A | 2/2000 | Derbenwick et al. |
| 6,066,868 A | 5/2000 | Evans, Jr. |
| 6,067,244 A | 5/2000 | Ma et al. |
| 6,069,381 A | 5/2000 | Black et al. |
| 6,087,688 A | 7/2000 | Furuta et al. |
| 6,091,621 A | 7/2000 | Wang et al. |
| 6,104,049 A | 8/2000 | Solayappan et al. |
| 6,121,648 A | 9/2000 | Evans, Jr. |
| 6,130,103 A | 10/2000 | Cuchiaro et al. |
| 6,140,672 A | 10/2000 | Arita et al. |
| 6,144,579 A | 11/2000 | Taira |
| 6,147,895 A | 11/2000 | Kamp |
| 6,150,184 A | 11/2000 | Evans et al. |
| 6,151,241 A | 11/2000 | Hayashi et al. |
| 6,151,242 A | 11/2000 | Takashima |
| 6,165,802 A | 12/2000 | Cuchiaro et al. |
| 6,171,934 B1 | 1/2001 | Joshi et al. |
| 6,194,751 B1 | 2/2001 | Evans, Jr. |
| 6,201,731 B1 | 3/2001 | Kamp et al. |
| 6,207,465 B1 | 3/2001 | Cuchiaro et al. |
| 6,225,156 B1 | 5/2001 | Cuchiaro et al. |
| 6,225,654 B1 | 5/2001 | Evans, Jr. et al. |
| 6,225,656 B1 | 5/2001 | Cuchiaro et al. |
| 6,236,076 B1 | 5/2001 | Arita et al. |
| 6,245,451 B1 | 6/2001 | Kamisawa et al. |
| 6,245,580 B1 | 6/2001 | Solayappan et al. |
| 6,246,602 B1 | 6/2001 | Nishimura |
| 6,255,121 B1 | 7/2001 | Arita et al. |
| 6,256,220 B1 | 7/2001 | Kamp |
| 6,285,577 B1 | 9/2001 | Nakamura |
| 6,307,225 B1 | 10/2001 | Kijima et al. |
| 6,310,373 B1 | 10/2001 | Azuma et al. |
| 6,319,542 B1 | 11/2001 | Summerfelt et al. |
| 6,322,849 B1 | 11/2001 | Joshi et al. |
| 6,326,315 B1 | 12/2001 | Uchiyama et al. |
| 6,335,550 B1 | 1/2002 | Miyoshi et al. |
| 6,339,238 B1 | 1/2002 | Lim et al. |
| 6,358,758 B1 | 3/2002 | Arita et al. |
| 6,362,068 B1 | 3/2002 | Summerfelt et al. |
| 6,365,927 B1 | 4/2002 | Cuchiaro et al. |
| 6,370,056 B1 | 4/2002 | Chen et al. |
| 6,372,518 B1 | 4/2002 | Nasu et al. |
| 6,373,743 B1 | 4/2002 | Chen et al. |
| 6,396,093 B1 | 5/2002 | Nakamura |
| 6,396,095 B1 | 5/2002 | Shimada et al. |
| 6,623,985 B1 | 9/2003 | Igarashi |
| 6,674,110 B1* | 1/2004 | Gnadinger .................. 257/295 |

FOREIGN PATENT DOCUMENTS

| | | |
|---|---|---|
| WO | WO98/13300 | 2/1998 |

OTHER PUBLICATIONS

Tokumitsu, Eisuke, et al, "Preparation of STN films by the sol-gel method for ferroelectric gate structures", IMF-10 Madrid/Spain (2001), pp. 105-110.

Tokumitsu, Eisuke et al, "Electrical Properties of MFIS and MFMIS FETs using ferroelectric SBT film and STO/SiON buffer layer", Jpn. J. of Appl.Phys., vol. 39, Apr. 2000, pp. 2125-2130.

Shin, Chang Ho et al, "Fabrication and characterization of MFIS FET using $Al_2O_3$ insulating layer for nonvolatile memory", ISIF 2001, 9 pages.

Lee, Ho Nyung et al., "CV characteristics of Pt/SBT/$CeO_2$/Si structure for non volatile memory devices", ISIF, 4 pages.

Choi, Hoon Sang et al, "Crystal Structure and electrical properties of Pt/SBT/$ZrO_2$/Si", J. of Korean Phys. Soc., vol. 39, No. 1, Jul. 2001, pp. 179-183.

Li, W.P. et al, "Improvement of MFS structures without buffer layers between Si and ferroelectric film", Applied Physics A, Springer (2000), pp. 85-87.

Han, Jin-Ping et al, "Memory effects of SBT capacitors on silicon with silicon nitride buffer", Integrated Ferroelectrics, 1998, vol. 22, pp. 213-221.

Miller, S.L. and Mcwhorter, P.J., Device Physics of the ferroelectric memory field effect transistor, ISIF Jun. 1992, pp. 5999-6010.

Kalkur, T.S., "Characteristics of MFS capacitors and MFSFETs with $BaMgF_4$ gate dielectrics", ISIF 1992, 1 page.

Wu, S.Y., IEEE Trans.Electron Devices ED 21, 499 (1974). An excellent review article referencing the same work was published in 1992 by Sinharoy, S. et al, "Integration of ferroelectric thin films into nonvolatile memories", J. Vac. Sci. Technol.A 10(4), Jul./Aug. 1992, pp. 1554-1561.

Chung, Ilsub et al., "Data Retention: Fabrication and characterization of MFISFET using CMOS process for single transistor memory applications", Integrated Ferroelectrics, 1999, vol. 27, pp. 31-39.

Miller, S.L. and Mcwhorter, P.J., "Theoretical investigation of a ferroelectric transistor: Physics of the ferroelectric nonvolatile memory field effect transistor", J. Appl.Phys. 72 (12), Sep. 9, 1992, pp. 5999-6010.

Smyth, D.M., "Charge Motion in ferroelectric thin films", Ferroelectrics, vol. 116, pp. 117-124 (1991), pp. 117-124.

Wu, S.Y. "A ferroelectric memory device, Metal-Ferroelectric-Semiconductor Transistor", IEEE Trans.Electron Devices, vol. ED-21, No. 8, Aug. 1994, pp. 499-504.

Moshnayaga, V. et al., "Preparation of rare-earth manganite-oxide thin films by metalorganic aerosol deposition technique", Appl. Phys. Lett., vol. 74, No. 19, pp. 2842-2844 (1998).

Kim, Kwang-Ho, "Metal-Ferroelectric—Semiconductor (MFS) FET's using LiNbO3/Si (100) Structures for nonvolatile memory applications", IEEE Electron Device Letters, vol. 19, No. 6, pp. 204-206 (Jun. 1998).

* cited by examiner

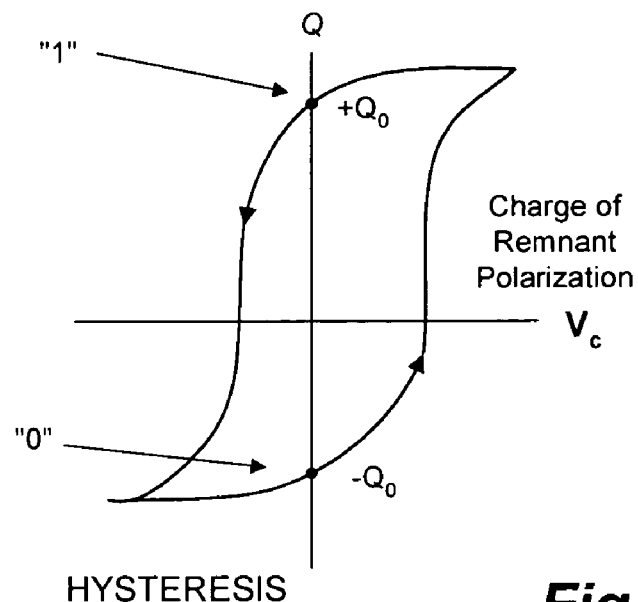
Fig. 1B
*Prior Art*
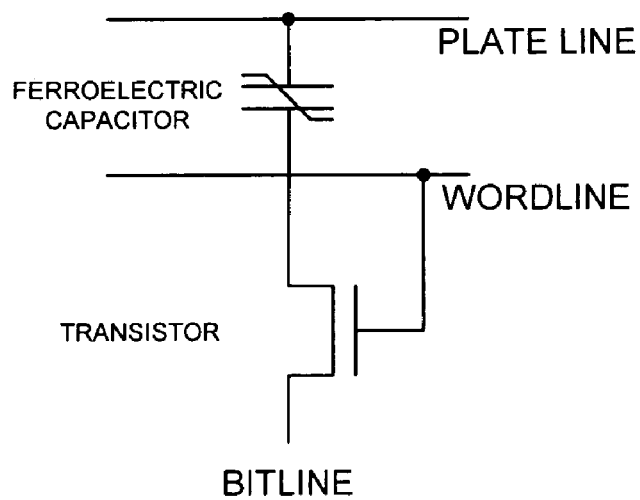
Fig. 1C
*Prior Art*
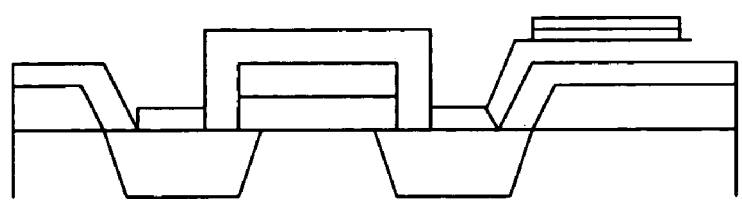

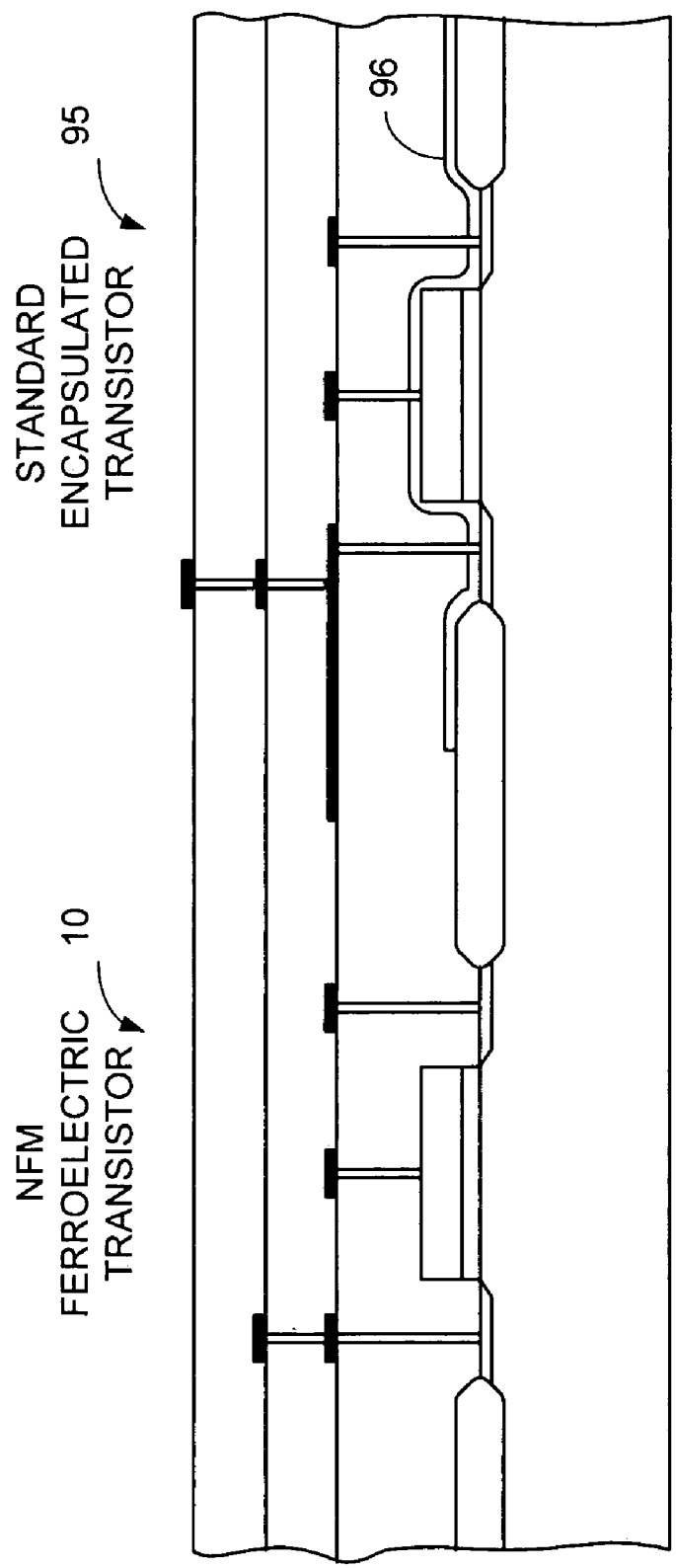

SINGLE TRANSISTOR RARE EARTH MANGANITE FERROELECTRIC NONVOLATILE MEMORY CELL

This applications is a 371 of PCT/US02/13095 filed Aug. 24, 2001, which claims benefit of provisional 60/227,858 filed Aug. 24, 2000 And claims benefit of provisional 60/272,986 filed Mar. 2, 2001.

FIELD OF THE INVENTION

The present invention relates to the field of nonvolatile memory devices using a single transistor as the only element in the memory cell and the formation of this transistor with a rare earth manganite thin film ferroelectric material as the gate dielectric.

BACKGROUND OF THE INVENTION

Nonvolatile ferroelectric random access memory (Fe-RAM) devices represent an emerging, multibillion-dollar market. The most advanced FeRAMs utilize a 1-transistor/1 capacitor (1T1C) cell technology and a destructive read out (DRO) scheme. These devices compete with EEPROMs, battery backed static RAMs (BBSRAMs), and Flash nonvolatile memory devices.

FeRAM is a type of semiconductor memory, constructed similarly to a Dynamic Random Access Memory (DRAM), but which stores bits of data without the need for power (nonvolatile characteristic). FeRAMs have gained recent interest because of the possibility that they could become the ideal memory of the future, replacing standard mass-produced DRAM. Although the basic fundamentals of ferroelectricity were discovered in the 1920's, developments within the last fifteen years regarding the use of thin ferroelectric films may now make it practical to develop a dense memory with ideal nonvolatile memory performance characteristics. Ferroelectric materials exhibit ferroelectric behavior below a critical temperature, known as the Curie temperature. The Curie temperatures of many ferroelectric materials are above 200° C. allowing them to be used as storage elements for nonvolatile semiconductor memories.

Prior art FeRAMs operate using an array of memory cells, which contain capacitors, built of a special dielectric material (a ferroelectric) sandwiched between two conducting material (electrode) layers. The special ferroelectric material is comprised of a lattice of ions, in which one of the ions in each unit cell has two stable states on either side of the center of the unit cell along an elongated axis as shown in FIG. 1a. When a voltage is applied across the top and bottom electrodes of a ferroelectric capacitor, the movement of these charged center ions creates a charge displacement within the dielectric. This charge displacement can be sensed as a current flowing between the electrodes of the ferroelectric capacitor. The charge displacement within a ferroelectric capacitor is often displayed as a hysteresis curve, where the polarization of the ferroelectric layer is plotted against the applied electric field, as shown in FIG. 1b.

FIG. 1c shows a schematic of a 1T1C memory cell. When a positive electric field is applied across a negatively polarized ferroelectric capacitor, the center ions of the unit cells switch to positively polarized states. This ion movement can be sensed as a current flow between the electrodes of the ferroelectric capacitor. When this electric field is removed, the polarization settles to the state labeled "$+Q_0$" (See FIG. 1b). If a negative external electric field is then applied across the ferroelectric capacitor, the center ions of the unit cells switch to negatively polarized states. When this electric field is removed, the polarization settles to the state labeled "$-Q_0$". FeRAMs offer an advantage over DRAMs because ferroelectric polarization can be retained in either state, $+Q_0$ or $-Q_0$, for a very long time (retention) without continuously applied power (nonvolatility). Unlike other nonvolatile memory elements, ferroelectric capacitors can be switched from state to state many times ($>10^{10}$ cycles) without wear-out (fatigue). Also, because the ferroelectric capacitors operate at low voltage, there is no need for high voltages provided by charge pumps to program (write) the memory as required for some nonvolatile memories (e.g., EEPROM and Flash). The low programming voltages ultimately allow ferroelectric memory cells to scale to smaller dimensions than Flash memory.

The prior art for processing FeRAMs requires the fabrication of ferroelectric capacitors after all of the underlying CMOS circuitry has been fabricated just prior to metalization. A typical cross section of a 1T1C cell has a ferroelectric capacitor placed on the field oxide, and is connected to the transistor with a local interconnect. This creates a processing concern, because ferroelectric materials must be activated after deposition at high temperatures. When the underlying CMOS circuitry is heated to high temperatures, hydrogen is released, which degrades the ferroelectric film. Depositing the metalization interconnect layers can also produce hydrogen. Thus, a hydrogen barrier must be added to protect the ferroelectric capacitors. Also, some ferroelectric materials are very sensitive to moisture, which can be formed when hydrogen is released. Finally, when dense memories are fabricated, planarization techniques are commonly used. Most processes require interconnect metalization to be added before the ferroelectric materials are deposited and activated. This interconnect metalization cannot withstand the high temperatures of ferroelectric film activation. All of these problems have slowed the development of dense FeRAMs and have clouded the future for an ideal memory.

The overriding disadvantage of prior art 1T1C cell memories is that under the best of circumstances they cannot be scaled aggressively enough to compete with Flash memory since they require 2 elements per cell compared to a single element in flash. With comparable design rules a prior art FeRAM has a cell size at lest twice the cell size of flash.

A cross section and a diagram of the proposed 1T-cell, the subject of this invention, are shown in FIG. 2. This cell operates quite differently from the prior art 1T1C cell. Instead of using the switched or non-switched charge as a signal (as in the 1T1C DRO cell) the magnitude of the drain current $I_d$ of the ferroelectric transistor is used to distinguish between the two logic states.

In the 1T-cell, shown in FIGS. 2a and 2b, if the polarization of the ferroelectric layer is down, the threshold voltage of the device is increased (to e.g., 1.5 volts) and the drain current is low (at a drain voltage $V_d$~0.3 volt, less than the threshold voltage), representing, for example, a logic "0". If the polarization is up, the threshold voltage of the device is decreased (to e.g., −2.5 volts) and the drain current is high, representing, for example, a logic "1". To write a cell, the cell is selected and a positive or negative voltage is applied to the gate of the selected transistor to write either a logic "1" (polarization up) or a logic "0" (polarization down). To read a cell, the cell is selected and a small drain voltage is applied to the selected cell. The sense amplifier determines if the drain current is high or low, representing a logic "1" or "0". See FIG. 2c.

A read operation does not change the polarization state of the device and, therefore, does not destroy the information ("non destructive read-out" or NDRO). The device does, therefore, not fatigue under a read operation (it only fatigues under a write operation), a major advantage over DRO memories. In addition to a fatigue-free read operation, a NDRO scheme is faster since no restore operation is needed, shortening the write cycle. NDRO also is potentially more reliable, especially in adverse environments (e.g., radiation) as encountered in military and space applications, as there is never an instance where the memory state is unidentified where an upsetting event (e.g., single event upset or SEU) could inadvertently alter the state of the memory.

The cell shown in FIG. 2a has a much smaller footprint than any known ferroelectric storage cell. It is potentially the smallest possible ferroelectric memory cell and is as dense as a Flash memory cell, the densest of any competing nonvolatile semiconductor memory technologies.

The challenges of building such a 1T ferroelectric memory cell is that the ferroelectric material has to be deposited directly on silicon instead of a metallic bottom electrode as in the prior art devices. This means that requirements for the ferroelectric material are quite different. The switched polarization ($P_r$) should be in a range of 0.1 to 1 $\mu C/cm^2$ and not as high as possible as in the prior art device. The dielectric permittivity should be as low as possible, ideally less than 20, and the leakage current over the operating voltage range (e.g. +−5 Volt) should be as low as possible. This applies both to electronic and ionic charge motion in the ferroelectric material, but most importantly for the slow moving ionic charge. In order for the information stored in a 1T cell to be preserved, the polarization charge cannot be compensated. Any ionic charge that would slowly drift through the films and accumulate at the ferroelectric interfaces to the electrodes could compensate the polarization charge over time and destroy the information.

SUMMARY OF THE INVENTION

The present invention is a memory device with a memory cell composed of a single transistor. This transistor is formed with a rare earth manganite as the thin film ferroelectric material that forms the gate dielectric of the ferroelectric transistor. This ferroelectric gate material is deposited directly on silicon; instead of a metallic or conductive oxide bottom electrode as in prior art ferroelectric devices. By its nature, the ferroelectric material has to be inserted early in the CMOS process. It has, therefore, to be able to withstand higher temperatures, most likely up to 950° C., (e.g. the activation temperature for the implanted source and drain junctions).

The requirements for the ferroelectric gate material are quite different from the ones in a 1T1C cell. In addition to the high temperature requirements and the low mobile ionic charge, it has to have a low dielectric constant, preferably less than 30. The reason for this is that any ferroelectric material deposited on silicon forms an interfacial layer with a rather low dielectric constant, most likely around 3.9, the value for $SiO_2$. A voltage applied to the gate of the transistor is, therefore, divided between the ferroelectric material and the interfacial layer. If the capacitance of the interfacial layer is much smaller than the capacitance of the ferroelectric layer, most of the voltage will drop over the interfacial layer and is not available for switching the ferroelectric material. It is, therefore, not possible to operate the device at low voltages. The ferroelectric material of the present invention has a low relative dielectric permittivity around 10 and forms an interfacial layer with a relative dielectric permittivity larger than that of $SiO_2$, which makes it ideal for a 1T cell.

The ferroelectric material of the present invention is quite different from the materials such as lead zirconate titanate (PZT) and strontium bismuth tantalate (SBT), which are the preferred materials in prior art devices. The device in a preferred embodiment of the current invention includes a substrate such as silicon, a thin film of a rare earth manganite as the ferroelectric material deposited directly onto this substrate and an electrode formed on top of the ferroelectric material. Source and drains are formed either before or after the ferroelectric layer deposition. The device is provided with contacts to the source and drain regions and to the gate electrode. Standard metalization (e.g. aluminum) is used to connect these contacts to other elements in an integrated circuit such as a CMOS circuit and to the outside world.

The ferroelectric material of the present invention is deposited directly on silicon and is composed of any rare-earth manganite with the formula $A^{3+}MnO_x$ (where A=Y, Ce, Pr, Nd, Pm, Sm, Eu, Gd, Tb, Dy, Ho, Er, Tm, Yb, or Lu) and x is between 1 and 3 inclusive.

The rare earth manganites used in the present invention have the desired properties for a successful operation of a 1T memory cell. They have dielectric permittivities of less than 20, they form a stable interfacial layer with a relatively high dielectric constant of ~30, they have a high transition temperature (Curie temperature) of >600° C. and they have inherently low mobile charges (e.g. oxygen vacancies). The ferroelectric polarization is in the ideal range of 0.1 to 2 $\mu C/cm^2$.

The ferroelectric materials of the present invention are deposited preferably by metallorganic chemical vapor deposition techniques (MOCVD), although other methods such as PECVD or MOD could be used. The MOCVD process preferably uses a liquid source delivery and flash evaporation method, since the precursors preferably used typically have low vapor pressure, making other methods such as vapor delivery with bubblers difficult. Examples of precursors used for $CeMnO_3$, a special embodiment of the current invention, are Cerium (IV) tris-tetramethylheptanedionate (thd) for Cerium (Ce) and Manganese (III) tris-tetramethylheptanedionate for Manganese (Mn). These materials are solid powders. They can be brought into solution with tetrahydrofuron (THF) as the solvent with tetraglyme added to prevent any early evaporation problems.

The MOCVD process produces rare earth manganite thin films with excellent uniformity and compositional control and good step coverage. Most importantly, it produces a well controlled interfacial layer of $A_xO_y$ that is enhanced by the subsequent anneal steps in $O_2$.

BRIEF DESCRIPTIONS OF THE DRAWINGS

FIG. 1b (PRIOR ART) is a hysteresis loop.

FIG. 1c (PRIOR ART) is a schematic diagram of a prior art 1T1C memory cell.

FIG. 4 shows a ferroelectric transistor of the present invention integrated into a standard CMOS manufacturing process.

DETAILED DESCRIPTION OF THE INVENTION

Figure 1A:
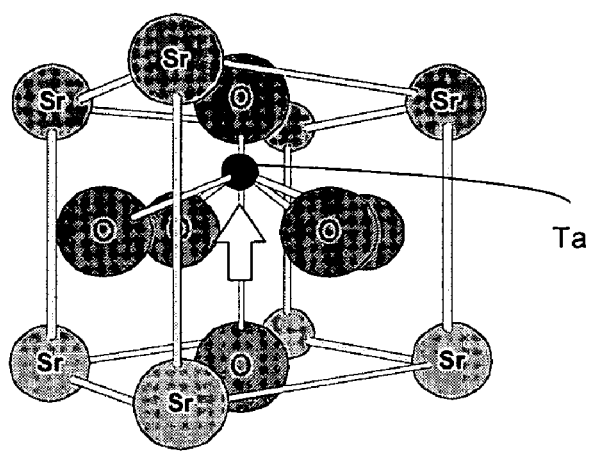
FIG. 1a (PRIOR ART) shows the crystal lattice of a ferroelectric material.
Figure 1A:
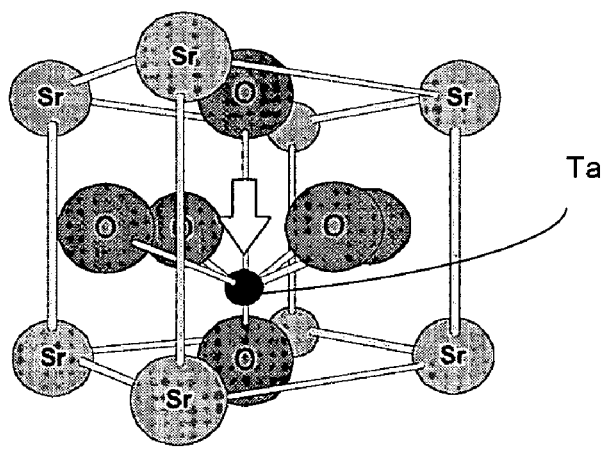
Figure 2A:
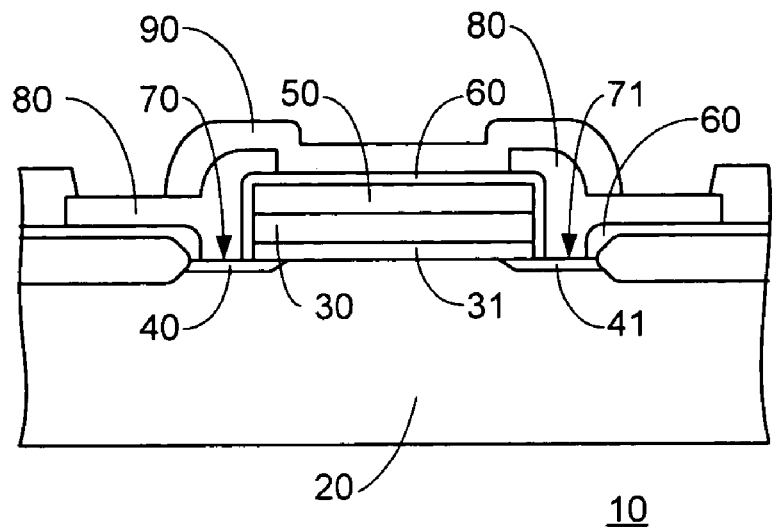
FIG. 2a shows a cross section of an embodiment of the present invention.
Figure 2B:
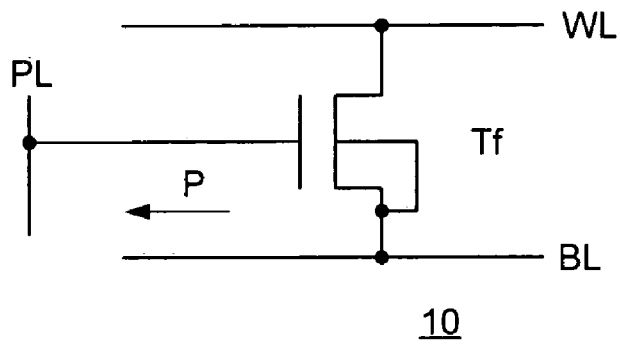
FIG. 2b shows a schematic diagram of an embodiment of the present invention.
Figure 2C:
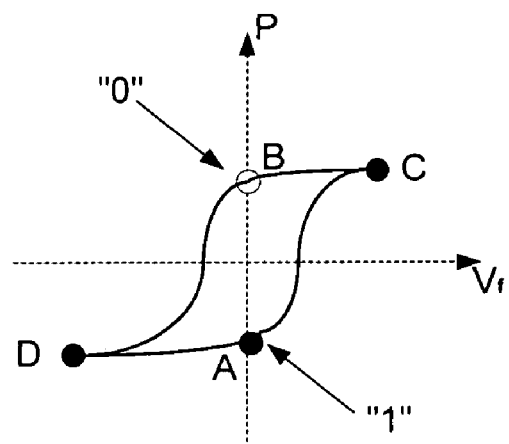
FIG. 2c shows a hysteresis loop for an embodiment of the present invention.
Figure 2D:
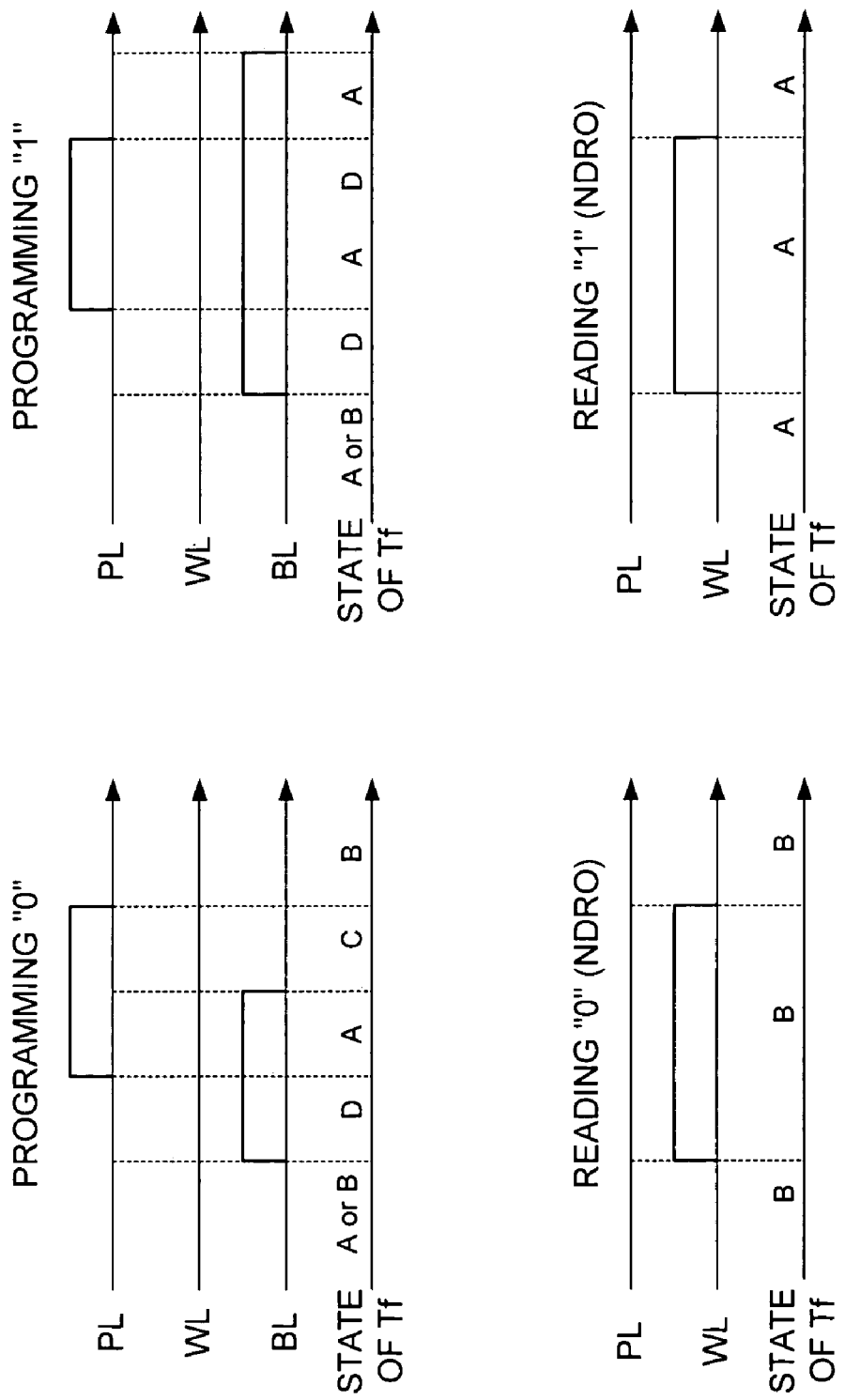
FIG. 2d shows the signals on the PL and WL line during the and reading of '0s' and '1s' for an embodiment of the present invention.

A description of a 1 transistor (1T) memory cell 10 in accordance with the present invention is shown in FIG. 2a. The 1T memory cell 10 consists of a substrate 20 of a suitable material such as silicon. Substrate 20 may be the starting material for a complex integrated circuit. Shown in FIG. 2a is only the memory cell itself. The cell may be the building block of a memory array that in turn is interconnected with peripheral circuitry such as decoders, sense amplifiers and input/output circuitry (not shown). A ferroelectric thin film layer 30 is deposited directly onto substrate 20. An interfacial layer 31 is formed between substrate 20 and ferroelectric layer 30 either automatically during deposition of ferroelectric layer 30 or deliberately as a separate processing step prior to deposition of ferroelectric layer 30. The ferroelectric layer 30 is deposited as described below and the interfacial layer is a mixture of the oxides of silicon and the rare earth.

The ferroelectric layer 30 may be patterned using standard photolithography and etch techniques. Source and drain regions 40 and 41 are formed adjacent to the patterned ferroelectric layer using standard techniques used in semiconductor processing. These regions 40 and 41 can either be formed before or after deposition of the ferroelectric layer 30. The most common scheme for source and drain formation is by ion implantation of, for example boron for p+ regions (p- channel transistors), or phosphorous or arsenic for n+ regions (n-channel transistors). Either type is part of the invention. On top of the ferroelectric layer, a conductive gate material 50 is deposited using standard techniques (e.g. CVD, sputtering), completing the basic ferroelectric transistor. They conductive gate material may be composed of platinum, gold or any other noble metal, iridium, rhodium, ruthenium or oxides thereof, doped polycrystalline silicon, or a metal silicide such as platinum silicide. The doping of polycrystalline silicon can occur during deposition of the polycrystalline silicon layer (in situ) or can be performed as a separate processing step after the polycrystalline silicon is deposited.

For a commercially useful transistor as past of an integrated circuit (e.g. CMOS), additional processing steps are required. An insulating layer 60 (e.g. $SiO_2$) is deposited on the gate material, contact windows 70, 71 are etched to source and drain and also to the gate electrode, respectively, and connections 80 are provided by standard metalization (e.g. aluminum). Finally, the device is properly passivated with a suitable passivation 90, e.g. polyimide, plasma oxide or plasma nitride.

The ferroelectric thin film 30 is a rare earth manganite with the general formula $A^{3+}MnO_x$ (where A=Y, Ce, Pr, Nd, Pm, Sm, Eu, Gd, Th, Dy, Ho, Er, Tm, Yb, or Lu) and x is between 1 and 3 inclusive.

Most rare earth magnates are uniaxial ferroelectrics in hexagonal crystal formation, with some in a cubic crystal lattice. These rare earth manganites possess properties that are ideal for 1 T cell type memory cells, the topic of the present invention. For example, their transition temperatures (Curie temperatures) are high relative to the maximum operating temperature of a circuit, in the range of 500 to 700° C. This property allows insertion of the ferroelectric film into a manufacturing process early in the process flow, for example prior to source/drain formation. The material can withstand the processing temperatures of >850° C. that is required to, for example, activate the junctions.

Rare earth manganites have low dielectric permittivties, in the range from 10 to 50, due to the closely packed crystal lattice in a hexagonal structure. The interfacial layer 31, on the other hand, has relatively high dielectric permittivities, in the range of 10 to 30, because it is a mixture of the rare earth oxide $A_xO_z$ and the silicon oxide $Si_vO_w$ with x,y,v,w in the range of 1 to 3. For example $Ce_2O_3$, $Y_2O_3$ and $Pr_2O_3$, preferred embodiments of the present invention, have relative dielectric permittivties of about 25, 20 and 30, respectively. The interfacial layer 31 either forms automatically during CVD deposition of the rare earth manganite, enhanced by the subsequent anneals in $O_2$, or is deposited deliberately, preferably by MOCVD in the same processing chamber and prior to the ferroelectric deposition. Using liquid delivery methods of the precursors allows easy deposition of this interfacial oxide. It can also be deposited by other means, for example by sputtering, e-beam evaporation or others.

The ferroelectric layer is preferably deposited by MOCVD, although other techniques such as MOD, sol-gel, PECVD and others can be used and are subject to this invention. The preferred embodiment of depositing the ferroelectric layer by MOCVD is by using a liquid source delivery method as described in U.S. Pat. No. 5,887,117, "Flash evaporator," the contents of which are incorporated by reference. An important element of this method is using at suitable precursor chemistry. A preferred embodiment is using Cerium (IV) tris-tetramethylheptanedionate (thd) for Cerium (Ce), Manganese (III) tris-tetramethylheptanedionate for Manganese (Mn) and tetrahydrofuron (THF) as the solvent.

Table I lists the preferred deposition conditions for depositing $CeMnO_3$.

TABLE 1

| | |
|---|---|
| Deposition temperature | 650° C., |
| Chamber pressure | 20 Torr |
| Rotational speed of the wafer holder | 900 rpm |
| Typical deposition time for 250 nm | 27 min. |
| Evaporator dome and shell temperature | 333° C. |
| Line temperatures | 345° C. |
| Reactor gas flow rates | Ar: 1,000 sccm, $O_2$: 3,750 sccm |
| Evaporator carrier gas flow rate | Ar: 150 sccm |

After deposition, the ferroelectric films have to be annealed in O2 at temperatures around 800 to 950° C. in order to form the proper ferroelectric phase. This anneal also slightly increases the thickness of the interfacial layer, an added advantage, since it improves the quality and reliability of this important oxide layer. The relatively high anneal temperature, which would be detrimental in prior art ferroelectric memory devices, is not a problem since the ferroelectric films are inserted into the process flow early, for example prior to source and drain formation.

Figure 3A:
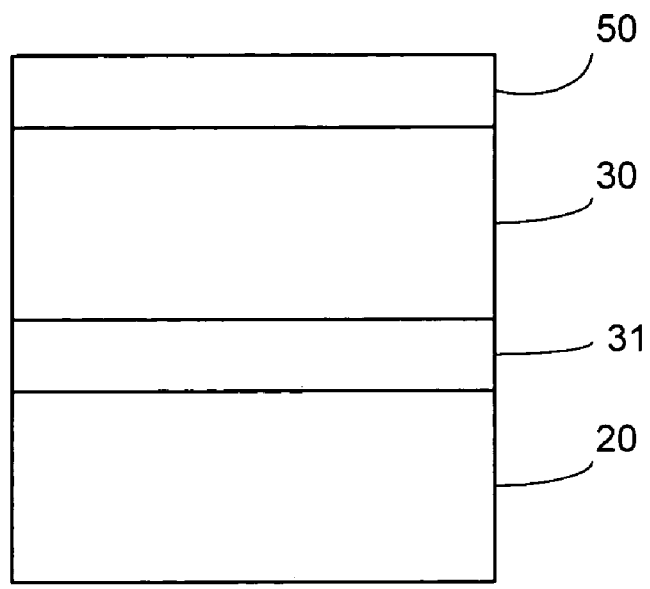
FIG. 3a shows a graph of an RBS spectrum for a ferroelectric thin film of a rare earth manganite deposited on a silicon substrate.
Figure 3B:
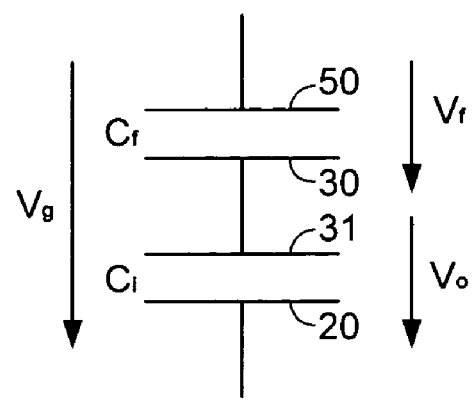
FIG. 3b shows the voltage drops over the ferroelectric thin film and the interfacial layer, shown in schematic form.

The combination of a low relative dielectric permittivity ferroelectric material on top of a high relative dielectric permittivity oxide interfacial layer is an important element of the present invention and is explained in more detail with reference to FIGS. 3a and 3b. FIG. 3a shows a cross section through the gate area of a ferroelectric transistor and FIG. 3b is a schematic representation of the 2 capacitors formed by the ferroelectric layer and the interfacial layer, respectively, connected in series. The applied gate voltage Vg between gate 50 and substrate 20 is divided between the ferroelectric layer 30 ($V_f$) and the interfacial layer 31 ($V_o$) according to the formula $$V_g = V_f + V_o.$$

The voltage $V_f$ is given by the equations below.

$$\in_f V_f t_o = \in_o V_o t_f$$

$$V_f = (\in_o / \in_f)(t_f/t_o) V_o = [1/(1+(\in_f/\in_o)(t_o/t_f))] V_g$$

where $t_f$ is the thickness of the ferroelectric layer and $t_o$ the thickness of the oxide layer. The effective voltage $V_g$ applied to the ferroelectric film is reduced by the ratio of dielectric permittivities of the interfacial layer and the ferroelectric films. In order to maximize the available voltage applied to the ferroelectric film, the voltage available for switching, the ratios ($\in_f/\in_o$) and ($t_o/t_f$) should be as low as possible. The rare earth manganites, the subject of the present inventions, satisfy this requirement.

The gate electrode 50 is formed of a conducting material consistent with CMOS processing. In prior art FeRAMs noble metals such as Pt are typically used in order to prevent unwanted oxides to form at the interfaces. In the present invention, oxide interfacial layers are not critical due to the low dielectric permittivity of the rare earth manganites. A much wider range of gate electrode materials can be used including noble metals, conductive oxide and, most importantly, doped polycrystalline silicon or metal suicides. These latter materials are particularly attractive since they are inexpensive and compatible with current CMOS processing.

The ferroelectric transistor of the present invention can be integrated into a standard CMOS manufacturing process as shown in FIG. 4. The ferroelectric transistor 10 can be formed prior to or after the formation of the standard CMOS transistors 95. If the ferroelectric transistor 10 is formed prior to the standard CMOS transistors 95, it is preferably encapsulated by a thin layer of a barrier material 96 that prevents any possible out diffusion of the materials composing the rare earth manganite films and possibly contaminating the remainder of the CMOS structure. This barrier material can be silicon nitride, aluminum oxide or others. If the ferroelectric transistor 10 is formed after the standard CMOS transistors 95, the standard CMOS transistors is encapsulated with a barrier material 96 to avoid any contamination from the any possible out diffusion of the materials composing the rare earth manganite films.

It should be clear that a number of aspects of the present invention have been disclosed, and any of them may have independent value and significance apart form the teachings as a whole. Further, it should be clear the present invention relates to a device and method of making and using such a device.

What is claimed is:

1. A memory device comprising:
   a substrate;
   a ferroelectric layer, said layer being a film of rare earth manganite; and
   an interfacial oxide layer being positioned between the substrate and the ferroelectric layer,
   wherein the ferroelectric layer has the general formula $A^{3+}MnO_x$ in which A=Y, Ce, Pr, Nd, Pm, Sm, Eu, Gd, Tb, Dy, Ho, Er, Tm, Yb, or Lu and x is between 1 and 3 inclusive.

2. The memory device of claim 1 further comprising a Pt gate electrode.

3. The memory device of claim 1 further comprising an Ir, $IrO_2$, $RuO_x$, Ro, $RoO_x$, or indium tin oxide (ITO) gate electrode.

4. The memory device of claim 1 further comprising a doped polycrystalline silicon gate electrode.

5. The memory device of claim 1 further comprising a polycide gate electrode.

6. The memory device of claim 1 further comprising a source region and a drain region.

7. The memory device of claim 1 wherein the interfacial layer comprises silicon, oxygen and at least one of the elements of the rare earth manganite film in the formula $SiO_yA_z$ where A is being selected from the group A=Y, Ce, Pr, Nd, Pm, Sm, Eu, Gd, Th, Dy, Ho, Er, Tm, Yb or Lu and x is between 0 and 2, y is between 1 and 3, and z is between 0 and all inclusive.

8. The memory device of claim 1 wherein the rare earth manganite film comprises a rare earth manganite film having a relative dielectric permittivity of less than 30.

9. The memory device of claim 1 further comprising a standard, non ferroelectric CMOS transistor in connection with the substrate and encapsulated with a protective layer to prevent contamination from the rare earth elements and the manganese coming from the ferroelectric layer and the interfacial oxide layer.

* * * * *